United States Patent [19]
Matsuura

[11] Patent Number: 5,479,111
[45] Date of Patent: Dec. 26, 1995

[54] SIGNAL TRANSMITTING DEVICE IN A SEMICONDUCTOR APPARATUS

[75] Inventor: Taketoshi Matsuura, Osaka, Japan

[73] Assignee: Matsushita Electronics Corporation, Osaka, Japan

[21] Appl. No.: 273,125

[22] Filed: Jul. 14, 1994

[30] Foreign Application Priority Data

Oct. 15, 1993 [JP] Japan .................................. 5-257396

[51] Int. Cl.⁶ .................................................. H03K 17/16
[52] U.S. Cl. .............................. 326/24; 326/83; 327/288
[58] Field of Search ...................... 326/24, 27; 327/264, 327/288

[56] References Cited

U.S. PATENT DOCUMENTS

| | | | |
|---|---|---|---|
| 4,596,939 | 6/1986 | Yamada | 307/290 |
| 4,896,056 | 6/1990 | Kunieda | 307/443 |
| 4,959,562 | 9/1990 | Ootani | 307/443 |
| 5,184,032 | 2/1993 | Leach | 307/443 |

FOREIGN PATENT DOCUMENTS

61-120516  6/1986  Japan .

Primary Examiner—Edward P. Westin
Assistant Examiner—Andrew Sanders
Attorney, Agent, or Firm—Willian Brinks Hofer Gilson & Lione

[57] ABSTRACT

In a signal transmitting device in a semiconductor apparatus, a second signal 29 and a third signal 40 are activated by the activation of a first signal 2 which is entered. More specifically, the third signal 40 is firstly activated, and the second signal 29 is then activated while the third signal 40 is being activated, and then the third signal 40 is inactivated. Further, a fourth signal 42 is activated by the activation of the second signal 29 or by the activation of the third signal 40. Accordingly, even though a noise removing circuit 80 or the like is disposed in a first signal transmitting circuit 70 for activating the second signal 29, the period of time required by the time the fourth signal 42 is activated, can be shortened. Thus, there can be obtained a semiconductor apparatus which is fast in access (speed at which a signal is transmitted to a subsequent stage) and which is resistant to noise.

15 Claims, 5 Drawing Sheets

SIGNAL TRANSMITTING DEVICE IN A SEMICONDUCTOR APPARATUS

BACKGROUND OF THE INVENTION

The present invention relates to a signal transmitting device in a semiconductor apparatus, and more particularly to improvements in a signal transmitting system having a large number of gate stages, for example a signal transmitting device having an additional circuit such as a noise removing circuit or the like for assuring a predetermined normal function.

Conventionally, there is known a semiconductor apparatus having a signal transmitting system in which the number of gate stages is increased because of provision of a large number of logical elements, e.g., a signal transmitting system having an additional circuit such as a noise removing circuit or the like to prevent an erroneous operation due to noise in an input signal such that a normal function is assured.

Figure 3:
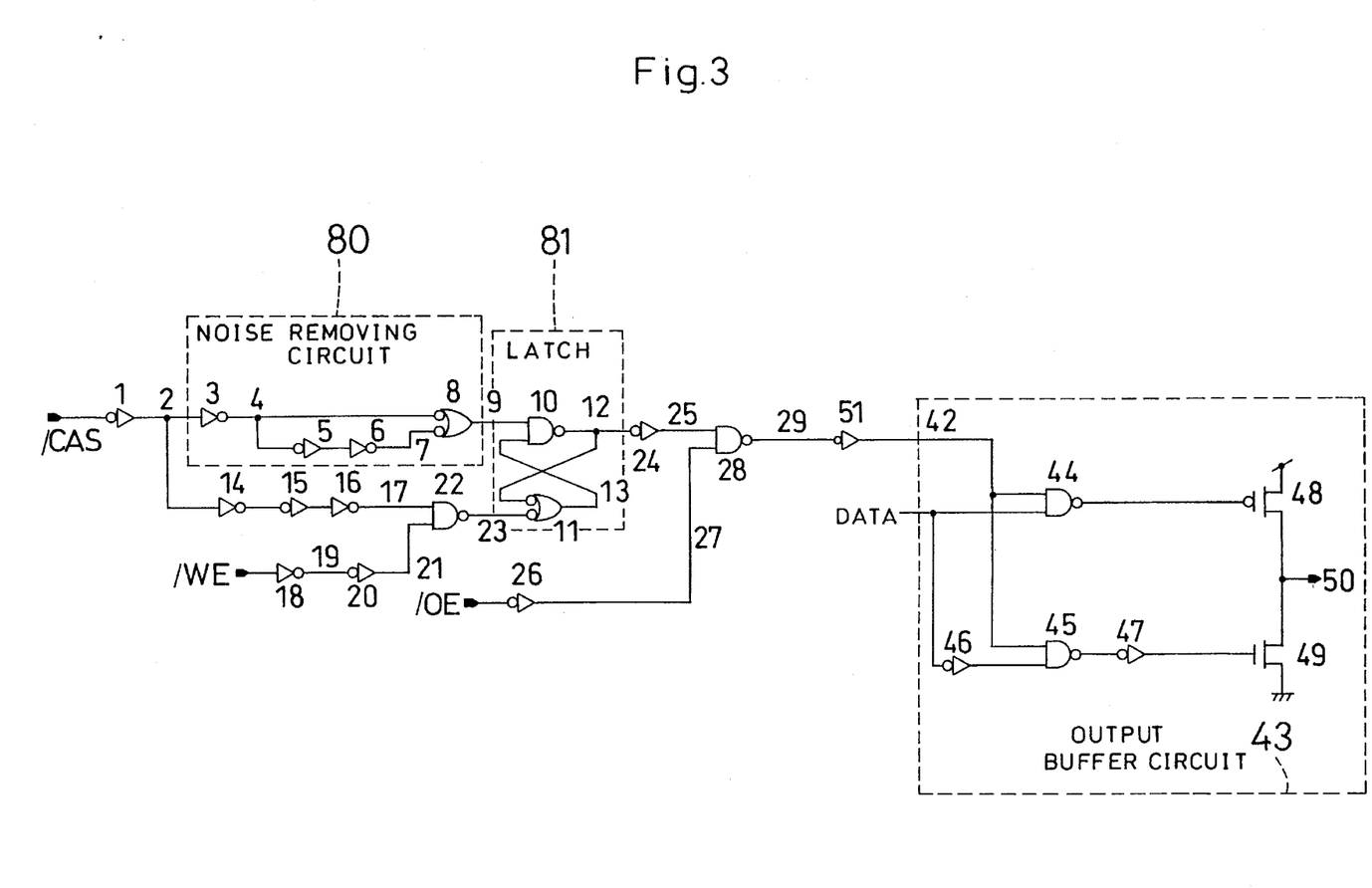
FIG. 3 is a circuit diagram of a conventional example.

With reference to FIG. 3, the following description will discuss, in the form of an output gate control circuit of a DRAM, a signal transmitting device in a conventional semiconductor apparatus having a noise removing circuit as an additional circuit.

In FIG. 3, a /CAS (Column Address Strobe) input circuit 1 is simplified as formed by an inverter. An output from the inverter 1 is turned into a signal 2, which is in an activated state at "H" and in an inactivated state at "L".

The signal 2 is entered into a noise removing circuit 80 which is formed by inverters 3, 5, 6 and a NAND circuit 8. In the noise removing circuit 80, the signal 2 is entered into the inverter 3, which supplies a signal 4. The signal 4 is delayed by the inverters 5, 6 and the inverter 6 generates a signal 7. The signals 4, 7 are entered into the NAND circuit 8, which generates a signal 9. The signal 9 is an output of the noise removing circuit 80. More specifically, even though the signal 4 becomes "H" due to momentary entry of reset noise into the signal 2 which is in the activated state, the signal 7 is held at "L" such that the signal 9 remains unchanged in the state "H", thus removing the noise.

The signal 9 from the noise removing circuit 80 is entered into a latch 81 which comprises a flip-flop circuit formed by two NAND circuits 10, 11. The signal 9 is entered into the NAND circuit 10. The NAND circuit 10 supplies a signal 12, which is then entered into the NAND circuit 11. A signal 13 from the NAND circuit 11 is entered into the other NAND circuit 10.

The signal 2 is delayed by inverters 14, 15, 16, and the inverter 16 generates a signal 17. A /WE (Write Enable) input circuit 18 is formed by an inverter and supplies an output signal 19. The signal 19 passes through an inverter 20, which inverts the signal 19 into a signal 21. The signals 17 and 21 are entered into a NAND circuit 22, which generates a signal 23. This signal 23 is entered into the NAND circuit 11 of the latch 81. The state of the signal 23 is latched by the latch 81.

The signal 12 from the latch 81 passes through an inverter 24, which inverts the signal 12 into a signal 25. An /OE (Output Enable) input circuit 26 is formed by an inverter and generates a signal 27. The signals 25, 27 are entered into a NAND circuit 28, which generates a signal 29. The signal 29 is a signal as obtained by latching the signal 23 from the NAND circuit 22.

The signal 29 passes through an inverter 51, which inverts the signal 29 into a signal 42. An output buffer circuit 43 is activated when the signal 42 is activated. The output buffer circuit 43 comprises: two NAND circuits 44, 45 to which the signal 42 and data are entered; an inverter 46 for inverting the data and giving a data inverting signal to the NAND circuit 45; an inverter 47 for inverting an output signal of the NAND circuit 45; and output transistors 48, 49. The output buffer circuit 43 supplies a signal 50.

The following description will discuss the roles and operations of the terminals of the DRAM. In the DRAM, a /CAS terminal is used for latching a column address and for controlling an output. A /WE terminal is used for determining an operation, either a reading or writing operation, to be conducted by the DRAM. More specifically, when the /WE terminal is in the state "H", a reading operation is carried out, and when the /WE terminal is in the state "L", a writing operation is carried out. However, the DRAM is arranged such that, when the /WE terminal is in the state "L" at the time the /CAS terminal is changed in state from "H" to "L", the state where the /WE terminal is in the state "L", is latched such that no data are supplied even though the /WE terminal is changed in state to "H" after the /CAS terminal has been changed from "H" to "L". This operation is called an early write mode. On the contrary, when the /WE terminal is in the state "H" at the time the /CAS terminal is changed in state from "H" to "L", a reading operation is conducted. However, if the /WE terminal is changed in state to "L" thereafter, the operation mode is immediately changed to a writing operation. More specifically, the state where that the /WE terminal is in the state "H", is not latched. In this case, writing is carried out while data are being read. Accordingly, when a data input terminal is identical with a data output terminal, data to be written and data to be read interfere with each other. In this connection, the DRAM has an /OE terminal which determines whether or not data is supplied. The DRAM is arranged such that no data is supplied when the /OE terminal is in the state "H", and data is supplied when the /OE terminal is in the state "L". More specifically, when the /CAS terminal is changed in state from "H" to "L" with the /WE terminal being in the state "H", a reading operation is carried out, but data can be supplied only when the /OE terminal is in the state "L". To conduct a writing operation thereafter, it is required that the /WE terminal is changed in state from "H" to "L" after the /OE terminal has been changed in state from "L" to "H" to stop data output. This operation is called delayed write or /OE controlled write. Also, there is an operation which validates both data output at the time of reading and data input at the time of writing. This operation is particularly called read modify write. For this operation, there are determined standards as to timing of an input signal to be given for transferring a reading operation to a writing operation.

The operations above-mentioned will be discussed in the form of operations conducted inside of the circuit in FIG. 3.

When the DRAM stands ready, the signal 2 becomes the state "L" since the /CAS terminal is in the state "H". Then, the signal 4 is in the state "H", the signal 9 is in the state "L", the signal 12 is in the state "H", the signal 25 is in the state "L", the signal 29 is in the state "H" and the signal 42 is in the state "L". Thus, no output is supplied.

Figure 4:
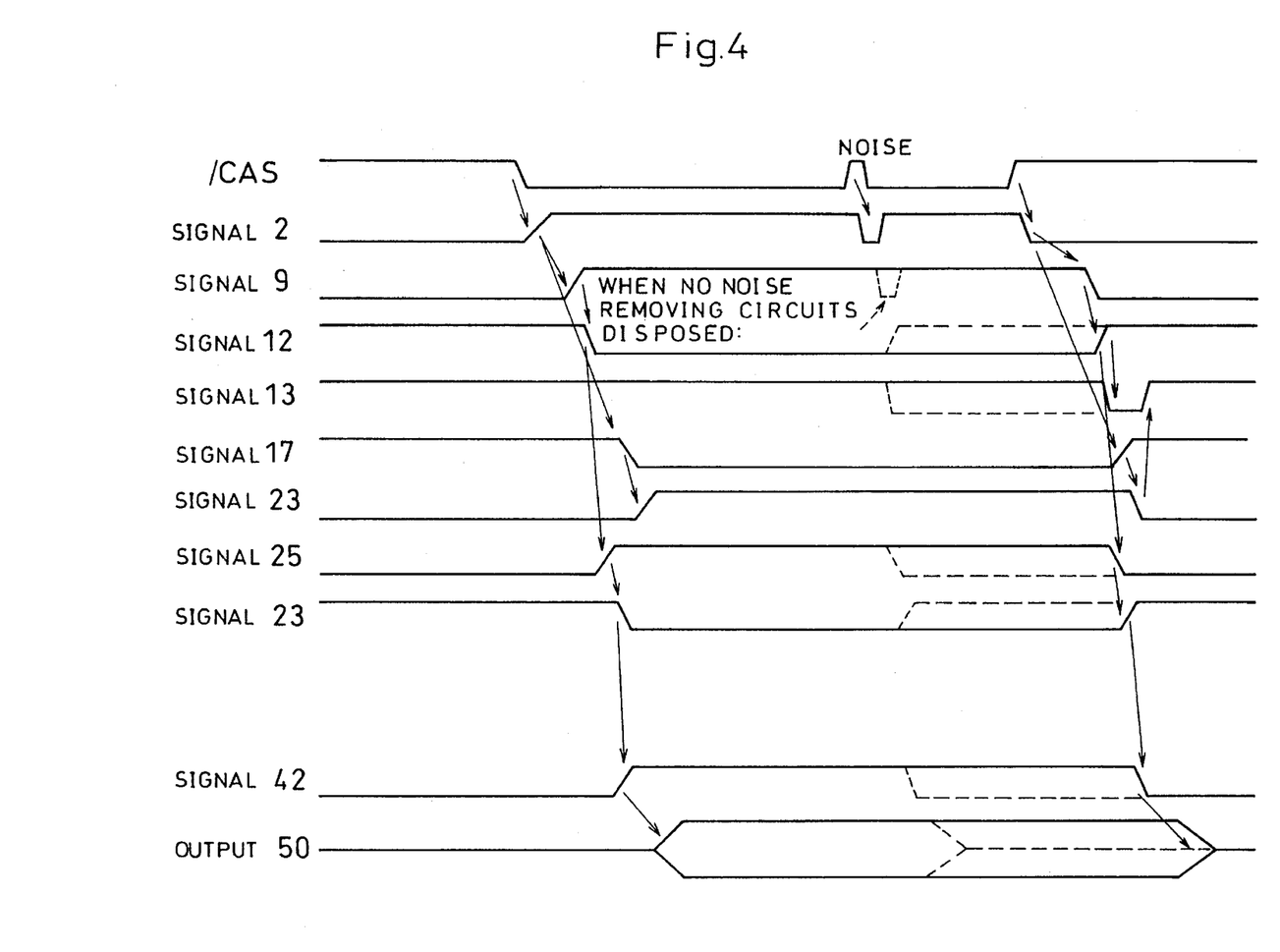
FIG. 4 is a reading timing chart in the conventional example.

The following description will discuss the reading operation also referring to a timing chart shown in FIG. 4. In this reading operation, the /CAS terminal is changed in state from "H" to "L" with the /WE terminal being in the state "H". Accordingly, when the /CAS terminal is in the state "H", the signal 23 is in the state "L" and the signal 13 is in the state "H". At this time, the /OE terminal is in the state "L" and the signal 27 is in the state "H". In this state, when the /CAS terminal is changed in state from "H" to "L", the signal 2 becomes the state "H" and the signal 9 becomes the state "H". Since the signal 13 is in the state "H", the signal 12 becomes the state "L" and the signal 13 is latched as "H". Here, even though reset noise mixingly enters the signal 2, the signal 9 is held at the state "H" by the noise removing circuit 80 and the output signal 12 of the NAND circuit 10 is held at the state "L". Accordingly, the signal 13 is continuously latched at "H". Thereafter, the signal 17 becomes the state "L" and the signal 23 becomes the state "H" as delayed by a predetermined period of time. Thereafter, since the signal 25 becomes the state "H" and the signal 27 becomes the state "H", the signal 29 becomes the state "L" and the signal 42 becomes the state "H", thus causing the output buffer circuit 43 to be activated. Accordingly, in the output buffer circuit 43, when the signal 42 is in the state "H", the output transistor 48 is activated to turn the output 50 into the state "H" when data is in the state "H", and the output transistor 49 is activated to turn the output 50 into the state "L" when the data is in the state "L".

Here, when the /WE terminal is changed from the state "H" to the state "L", the signal 21 becomes the state "L". However, since the signal 17 is already in the state "L", the signal 23 remains unchanged in the state "H". Accordingly, the states of the subsequent signals remain unchanged and the output buffer circuit 43 remains in the activated state so that the output 50 undergoes no change.

Figure 5:
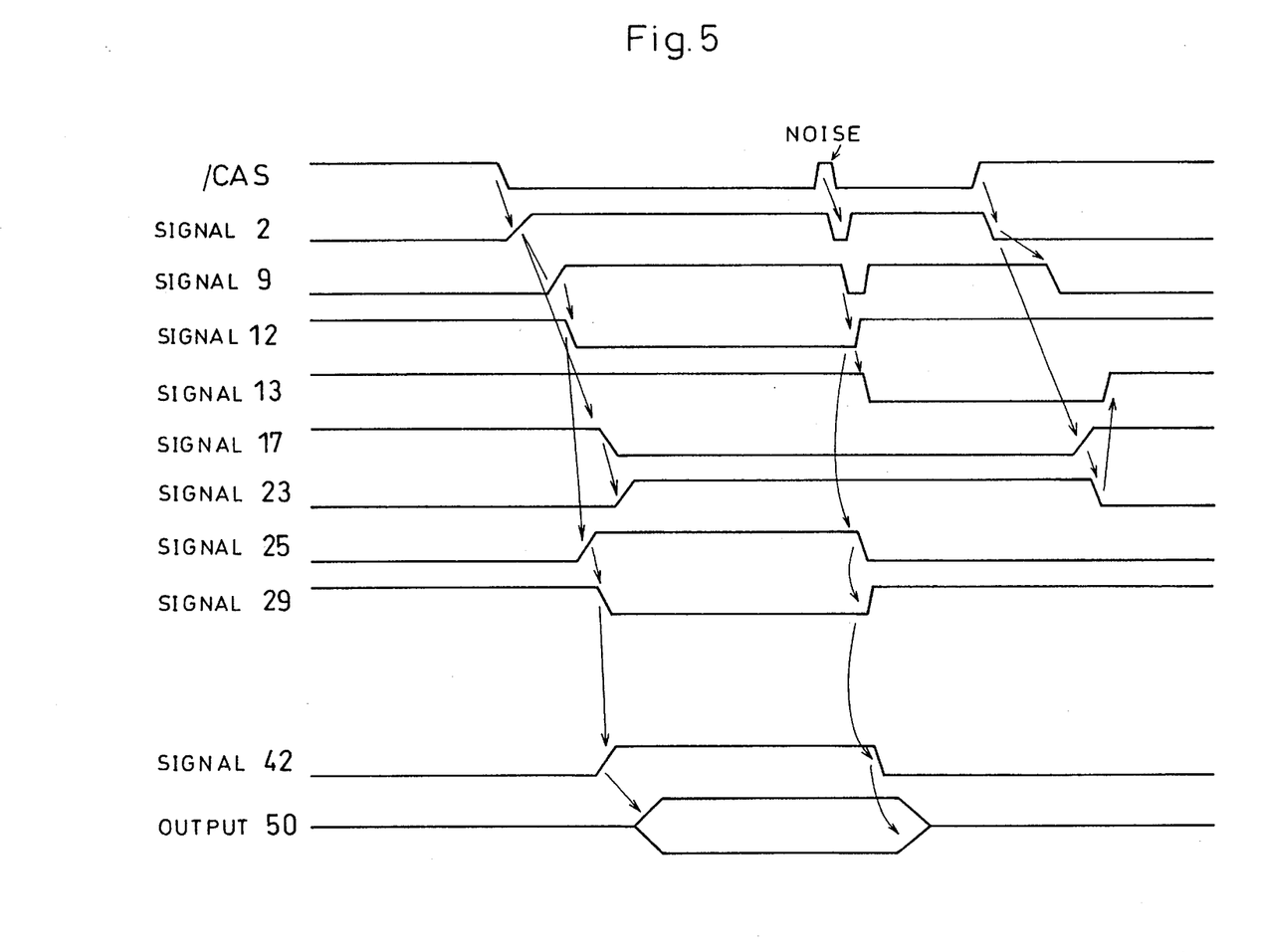
FIG. 5 is a timing chart of the conventional example with the noise removing circuit taken away.

The following will discuss the case when there is not disposed the noise removing circuit 80 shown in FIG. 3. As shown in FIG. 5, when noise which is momentarily turned to "H", is entered at the time when the /CAS terminal is in the state "L", the signal 2 momentarily becomes the state "L". This signal 2 is entered, as it is as the signal 9, into the NAND circuit 10 of the latch 81, and the signal 12 momentarily becomes the state "H". Since the signal 23 is already in the state "H", the signal 13 becomes the state "L". Accordingly, even though the signal 9 is returned to the state "H", the signal 12 is latched as in the state "H" because the signal 13 is in the state "L". As a result, the signal 29 becomes the state "H" and the output buffer circuit 43 is inactivated so that the output 50 is not supplied. However, when the noise removing circuit 80 is disposed, it is possible to prevent the output buffer circuit 43 from being inactivated due to noise at the time of a reading operation. This prevents such an erroneous operation as to stop the output 50.

The following will discuss a writing operation in the form of an early write operation where the /CAS terminal is changed from the state "H" to the state "L" with the /WE terminal being in the state "L". It is considered that the circuit stands ready immediately before the /CAS terminal is changed from the state "H" to the state "L". Further, the signal 21 from the /WE terminal is in the state "L". Accordingly, the signal 23 becomes the state "H". Further, since the signal 12 is in the state "H", the signal 13 is in the state "L". Here, when the /CAS terminal is changed from the state "H" to the state "L", the signal 2 is activated as changed from the state "L" to the state "H", and the signal 9 becomes the state "H". However, since the signal 13 is in the state "L", the signal 12 remains unchanged in the state "H". Thereafter, even though the signal 17 is changed from the state "H" to the state "L" after a predetermined delay time from the point of time that the signal 2 is activated, the signal 21 form the /WE terminal is in the state "L". Accordingly, the signal 23 remains unchanged in the state "H". As mentioned earlier, since the signals 12, 23 remain unchanged in the state "H", the signal 13 remains in the state "L". Accordingly, the states of the subsequent signals remain in the waiting states above-mentioned. That is, since the signal 42 becomes the state "L", the output buffer circuit 43 is inactivated so that the output 50 is not supplied.

Then, when the /WE terminal is returned from the state "L" to the state "H", the signal 21 is changed from the state "L" to the state "H". However, since the signal 17 is in the state "L", the signal 23 remains unchanged and the signal 42 remains in the state "L". Therefore, the output buffer circuit 43 is not activated so that the output 50 is still not supplied.

However, a semiconductor apparatus having such a conventional signal transmitting system having a large number of gate stages, presents the following problem. That is, because of a large number of gate stages, it takes much time to activate a signal to be ultimately supplied from the signal transmitting system, thus lowering the operation in speed.

The problem above-mentioned will be specifically discussed with reference to the arrangement of a semiconductor apparatus having the conventional noise removing circuit shown in FIG. 3. In the circuit in FIG. 3, between the point of time that the /CAS terminal is turned to the state "L" to activate the signal 2 and the point of time that the signal 29 is activated, there are six-stage gates including the inverter 1, the inverter 3, the NAND circuit 8, the NAND circuit 10, the inverter 24 and the NAND circuit 28. Thus, it takes time before the signal 29 is activated.

If the noise removing circuit 80 is taken away, the number of the gate stages can be reduced to four stages to increase the signal transmission in speed. However, without a noise removing circuit, the signal transmitting system cannot perfectly resist against noise. Thus, such a noise removing circuit cannot be taken away.

DISCLOSURE OF THE INVENTION

To solve the problem above-mentioned, the present invention is proposed with the object of providing a signal transmitting device in a semiconductor apparatus which is resistant to noise or the like and which can carry out a normal operation at a high speed even though the semiconductor apparatus has a signal transmitting system having a large number of gate stages.

To achieve the object above-mentioned, the present invention has, in addition to an existing signal transmitting system having a large number of gate stages, a signal transmitting system in which the number of gate stages is smaller than the number of gate stages in the existing signal transmitting system, the additional signal transmitting system being in parallel with the existing signal transmitting system, thus improving signal transmission in speed. In the present signal transmitting device, provision is further made such that, even though while a signal is being supplied by the additional signal transmitting system, noise mixingly enters such a signal to prevent the signal from being perfectly supplied, the signal can be supplied again, thus assuring a normal operation.

More specifically, the present invention provides a signal transmitting device in a semiconductor apparatus in which a first signal as an input signal is entered to generate second and third signals, thereby to supply a fourth signal, and is characterized in that the signal transmitting device comprises: a first signal transmitting circuit which receives the first signal and activates the second signal by the activation of the first signal; a second signal transmitting circuit which receives the first signal and activates the third signal by the activation of the first signal while the second signal is being activated by the first signal transmitting circuit, and which maintains the activation of the third signal at least until the second signal is activated; and a third signal transmitting circuit for activating the fourth signal while the second signal is being activated by the first signal transmitting circuit or while the third signal is being activated by the second signal transmitting circuit.

According to the present invention, the second signal transmitting circuit may be specifically arranged as having a logical circuit which receives the first signal and which forms logical multiplication or logical sum of the first signal as activated and a signal which is obtained by delaying, by a predetermined period of time, the first signal and which has a phase reverse to that of the first signal, an output of the logical circuit serving as the third signal.

In the signal transmitting device having the arrangement above-mentioned according to the present invention, when the first signal as an input signal is activated, the third signal is firstly activated by the second signal transmitting circuit in which the number of gate stages is smaller, and the third signal transmitting circuit then supplies the fourth signal, thus enabling the operation to be carried out at a higher speed. The activation of the third signal is maintained until the second signal is activated by the first signal transmitting circuit in which the number of gate stages is larger, and the state that the fourth signal is supplied by the third signal transmitting circuit, is thereafter maintained by the activated second signal.

Further, even though noise mixingly enters the third signal supplied from the second signal transmitting circuit having a smaller number of gate stages and consequently an output of the third signal from the second signal transmitting circuit is stopped, the activation of the second signal by the first signal transmitting circuit having a larger number of gate stages is maintained, so that the third signal transmitting circuit again supplies the fourth signal. Thus, the present signal transmitting device is resistant to noise and can securely carry out a normal operation.

In the signal transmitting device in a semiconductor apparatus according to the present invention, if noise momentarily mixingly enters, at a stage before the second signal is activated by the first signal transmitting circuit having a larger number of gate stages, the third signal supplied from the second signal transmitting circuit at an earlier stage, an output of the second signal transmitting circuit is stopped to temporarily stop an output of the fourth signal from the third signal transmitting circuit. However, at the point of time that the noise is gone, the second signal transmitting circuit again supplies the third signal. Accordingly, yet assuring a high-speed operation, an erroneous operation can be securely prevented because the operation of supplying the fourth signal is continuously conducted in spite of the presence of noise.

These and other features, objects, and advantages of the present invention will be more fully apparent from the following detailed description set forth below when taken in conjunction with the accompanying drawings.

BRIEF DESCRIPTION OF THE DRAWINGS

The attached drawings show a preferred embodiment of the present invention, wherein.

DETAILED DESCRIPTION OF THE INVENTION

The following will discuss a preferred embodiment of the present invention with reference to attached drawings.

Figure 1:
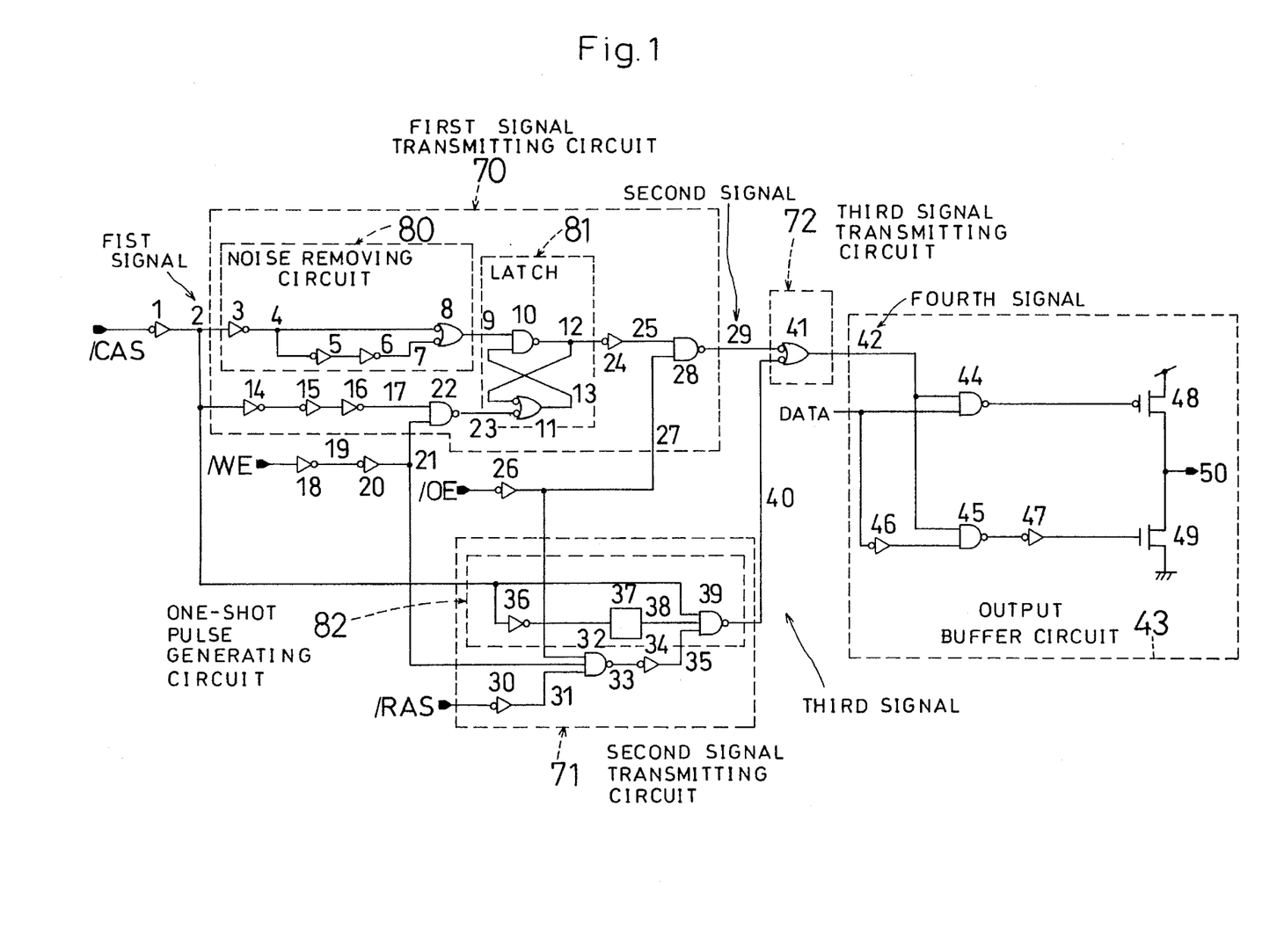
FIG. 1 is a circuit diagram of an embodiment of the present invention.

FIG. 1 shows an embodiment of the present invention which is applied to an output gate control circuit of a DRAM. Shown in FIG. 1 are a first signal transmitting circuit 70, a second signal transmitting circuit 71 in parallel with the first signal transmitting circuit 70, a third signal transmitting circuit 72 adapted to receive signals from the first and second signal transmitting circuits 70, 71, and an output buffer circuit 43 adapted to receive a signal from the third signal transmitting circuit 72.

The first signal transmitting circuit 70 comprises a noise removing circuit 80, a latch 81, inverters 14, 15, 16, and a NAND circuit 22, an inverter 24, a NAND circuit 28. The first signal transmitting circuit 70 is adapted to receive a first signal 2 and to generate a second signal 29. The noise removing circuit 80 comprises inverters 3, 5, 6 and a NAND circuit 8. The latch 81 comprises a flip-flop circuit formed by two NAND circuits 10, 11.

The second signal transmitting circuit 71 comprises a one-shot pulse generating circuit 82, a /RAS (Row Address Strobe) input circuit 30 comprising an inverter, an inverter 34, and a three-input NAND circuit 32. The second signal transmitting circuit 71 is adapted to receive the first signal 2 and to generate a third signal 40.

The one-shot pulse generating circuit 82 comprises an inverter 36 for inverting the first signal 2 to reverse the phase thereof, a delay circuit 37 for giving a delay of a predetermined period of time to a signal from the inverter 36, and a NAND circuit 39. The delay circuit 37 is adapted to determine a period of time t (See FIG. 2 to be discussed later) during which the third signal 40 is activated. This period of time t is determined such that the activation of the third signal 40 is maintained at least until the second signal 29 of the first signal transmitting circuit 70 is activated or turned to the state "L". The NAND circuit 39 is a logical circuit which forms logical multiplication of the first signal 2 as activated and a signal obtained in the manner that a signal obtained by inverting the activated first signal 2 by the inverter 36 is delayed, by a predetermined period of time, by the delay circuit 37. The output 40 from the NAND circuit 39 serves as the third signal. The NAND circuit 39 may be formed by a logical circuit which suitably forms logical sum.

In the second signal transmitting circuit 71, an input signal from a /RAS terminal is entered into the /RAS input circuit 30, which in turn supplies a signal 31. Signals 21, 27, 31 are entered into the three-input NAND circuit 32, which in turn supplies a signal 33. The signal 33 is inverted into a signal 35 through an inverter 34. The output signal 2 of the /CAS input circuit 1 is entered into the inverter 36 and turned into a signal 38 as delayed by the delay circuit 37. When the first signal 2 becomes the state "H", the signal 38 becomes the state "L" with a delay. The signals 2, 35, 38 are entered into the three-input NAND circuit 39, which in turn generates the third signal 40.

The third signal transmitting circuit 72 comprises only a NAND circuit 41. The second signal 29 and the third signal 40 are entered into the NAND circuit 41, which in turn generates a fourth signal 42.

The output buffer circuit 43 comprises NAND circuits 44, 45, inverters 46, 47, and output transistors 48, 49. When the fourth signal 42 from the third signal transmitting circuit 72 is activated, the output buffer circuit 43 is activated.

The following description will discuss the operation of the signal transmitting device having the arrangement above-mentioned. The following will discuss mainly the operation of the second signal transmitting circuit 71 because the operations of the first signal transmitting circuit 70 and the output buffer circuit 43 are the same as those in the conventional example in FIG. 3.

Figure 2:
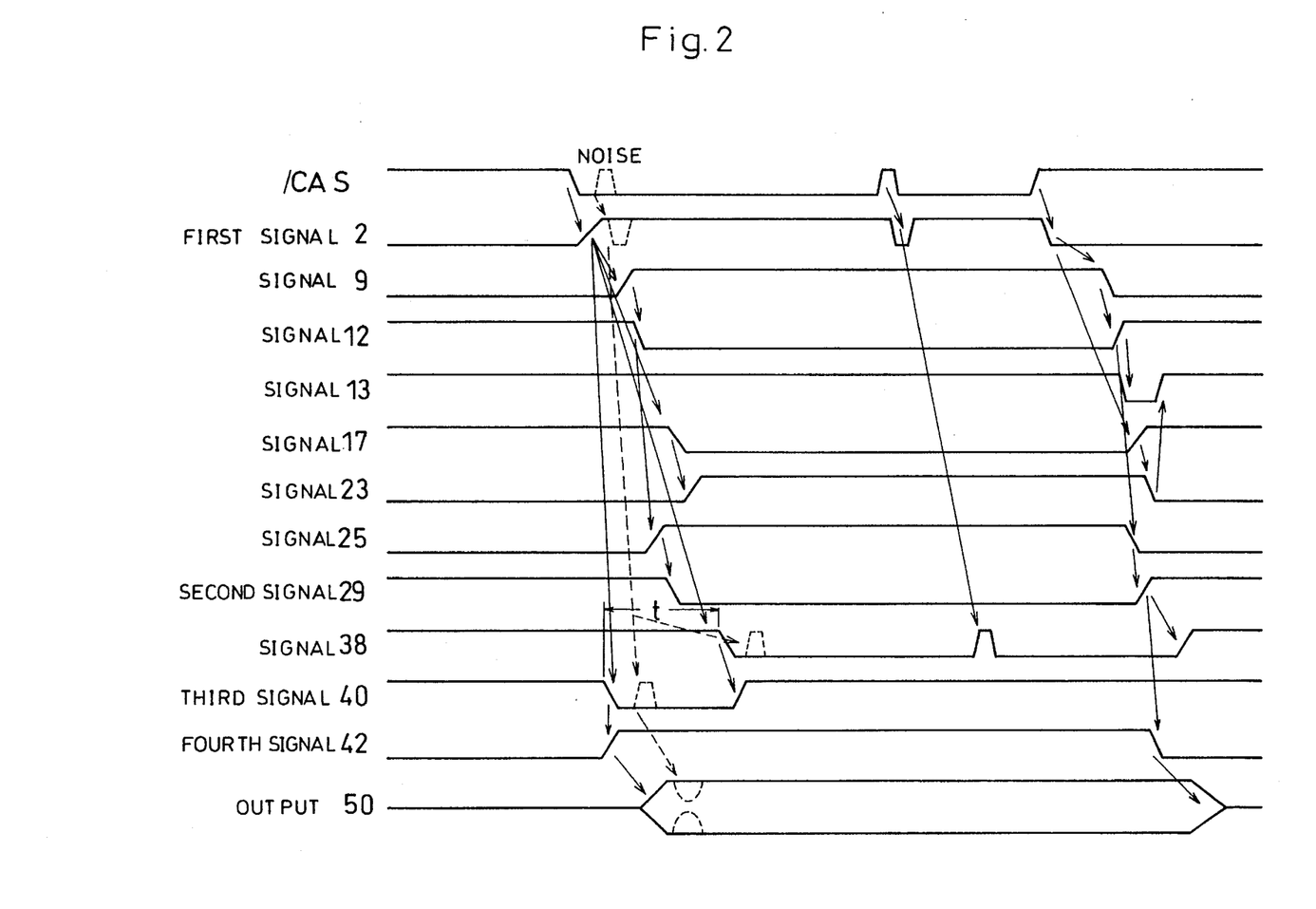
FIG. 2 shows a reading timing chart in the embodiment of the present invention.

First, a reading operation is to be discussed based on the timing chart in FIG. 2. In the second signal transmitting circuit 71, when the /RAS terminal is turned to the state "L", the signal 31 becomes the state "H". The /OE terminal is in the state "L" and the signal 27 is in the state "H". Since the /WE terminal is in the state "H", the signal 21 is in the state "H". Accordingly, the signal 33 is brought to the state "L" and the signal 35 is brought to the state "H". Here, when the /CAS terminal is in the state "H", the first signal 2 is in the state "L" and the signal 38 is in the state "H". Immediately after the /CAS terminal is turned to the state "L", the first signal 2 becomes the state "H" and all inputs to the three-input NAND circuit 39 become the state "H". Accordingly, the third signal 40 becomes the state "L" and is therefore activated. Thereafter, when the delay time of the delay circuit 37 has passed and the signal 38 becomes the state "L", the third signal 40 becomes the state "H" and is therefore inactivated. Simultaneously, there is conducted, in the first signal transmitting circuit 70, an operation of activating the second signal 29 which is an output of the first signal transmitting circuit 70, as already shown in the conventional example. Accordingly, while the third signal 40 of the second signal transmitting circuit 71 is activated, the second signal 29 is activated, so that the fourth signal 42 of the third signal transmitting circuit 72 is continuously activated.

The following will discuss a case where, with the third signal 40 activated in the state "L", momentary noise mixingly enters the first signal 2, causing the first signal 2 to be turned to the state "L". In this case, when the first signal 2 is turned to the state "L", the output or third signal 40 from the three-input NAND circuit 39 of the one-shot pulse generating circuit 82 becomes the state "H". As shown by broken lines in FIG. 2, however, when the noise mixingly entering the first signal 2 is gone within the delay time t during which the signal 38 from the delay circuit 37 in the one-shot pulse generating circuit 82, is held as "H", the third signal 40 from the NAND circuit 39 is reset again to the state "L". Accordingly, the fourth signal 42 is again supplied from the NAND circuit 41 of the third signal transmitting circuit 72, and an output signal 50 of the output buffer circuit 43 is again activated. Therefore, even though momentary noise mixingly enters the first signal 2 while the third signal 40 is activated before usual activation of the second signal 29, the signal 50 is again supplied from the output buffer circuit 43. This assures a high-speed operation while preventing the occurrence of erroneous operation due to noise.

The following will discuss a writing operation. In the early write operation, the /RAS terminal becomes the state "L" and the signal 31 becomes the state "H". Because of the early write operation, the /WE terminal is in the state "L" and the signal 21 is in the state "L". The point of time that the /WE terminal becomes the state "L", may be before or after the /RAS terminal becomes the state "L". The /OE terminal is in the state "L" and the signal 27 is in the state "H". Immediately after the /CAS terminal becomes the state "H", the first signal 2 is in the state "L" and the signal 38 is in the state "H". Further, since the signal 21 is in the state "L", the signal 33 becomes the state "H" and the signal 35 becomes the state "L". Accordingly, the third signal 40 is in the state "H". When the /CAS terminal is changed from the state "H" to the state "L", the first signal 2 is firstly turned to the state "H" and the signal 38 is then turned to the state "L". Accordingly, there is present a period where both the first signal 2 and the signal 38 are in the state "H". However, since the signal 35 is in the state "L", the third signal 40 remains in the state "H" regardless of the states of the first signal 2 and the signal 38. Accordingly, the fourth signal 42 is not activated.

According to this embodiment the number of gate stages between the point of time that the first signal 2 is activated and the point of time that the third signal 40 is activated, is one. i.e., the NAND circuit 39 in the one-shot pulse generating circuit 82 of the second signal transmitting circuit 71. Accordingly, the period of time taken by the time the fourth signal 42 is activated, is determined by the period of time taken by the time the third signal 40 is activated, but does not depend on the period of time taken by the time the second signal 29 is activated. Thus, even though the number of gate stages is large in the first signal transmitting circuit 70 for activating the first signal 2, such number has no relation to the period of time taken by the time the fourth signal 42 is activated. Therefore, even though the flip-flop circuit 81 and the noise removing circuit 80 are disposed in the first signal transmitting circuit 70, this does not change the period of time taken by the time the fourth signal 42 is activated, but the operation can be increased in speed by the third signal 40 of the second signal transmitting circuit 71 in which the number of gate stages is smaller. Further, the third signal 40 has been inactivated after the second signal 29 is activated. Thus, the inactivation of the fourth signal 42 only depends on the second signal 29 after the second signal 29 is activated. Accordingly, the operational speed can be improved, yet assuring resistance to noise equivalent to conventional one.

In the embodiment above-mentioned, the description has been made on a DRAM, but the present invention may also be applied to other semiconductor apparatus than a DRAM. More specifically, the present invention may be arranged such that there is connected in parallel, to an existing signal transmitting circuit, a signal transmitting circuit having gate stages in number which is smaller than the number of gate stages in the existing signal transmitting circuit, and that the activation of a signal from the additional signal transmitting circuit is maintained until a signal from the existing signal transmitting circuit is activated.

What is claimed is:

1. A signal transmitting device in a semiconductor apparatus in which a first signal as an input signal is entered, second and third signals are generated, and a fourth signal is supplied, comprising:

a first signal transmitting circuit which receives the first signal and activates the second signal by the activation of said first signal:

a second signal transmitting circuit which receives said first signal and activates the third signal by the activation of said first signal before said second signal is activated by said first signal transmitting circuit, and which maintains the activation of said third signal at least until said second signal is activated; and a third signal transmitting circuit which receives either said second signal or said third signal and activates the fourth signal while said second signal is being activated by said first signal transmitting circuit or while said third signal is being activated by said second signal transmitting circuit.

2. A signal transmitting device in a semiconductor apparatus in which a first signal as an input signal is entered, second and third signals are generated, and a fourth signal is supplied, comprising:

a first signal transmitting circuit which receives the first signal and activates the second signal by the activation of said first signal;

a second signal transmitting circuit which receives said first signal and activates the third signal by the activation of said first signal before said second signal is activated by said first signal transmitting circuit, and which inactivates said third signal after said second signal has been activated; and a third signal transmitting circuit which receives either said second signal or said third signal and activates the fourth signal while said second signal is being activated by said first signal transmitting circuit or while said third signal is being activated by said second signal transmitting circuit.

3. A signal transmitting device in a semiconductor apparatus according to either claim 1 or claim 2, wherein the second signal transmitting circuit is formed by a one-shot pulse generating circuit.

4. A signal transmitting device in a semiconductor apparatus in which a first signal as an input signal is entered, second and third signals are generated, and a fourth signal is supplied, comprising:

a first signal transmitting circuit which receives the first signal and activates the second signal by the activation of said first signal;

a second signal transmitting circuit having a logical circuit which receives said first signal and which forms logical multiplication or logical sum of said first signal as activated and a signal which is obtained by delaying, by a predetermined period of time, said activated first signal and which has a phase reverse to that of said first signal, an output of said logical circuit serving as the third signal; and a third signal transmitting circuit which receives either said second signal or said third signal and activates the fourth signal while said second signal is being activated by said first signal transmitting circuit or while said third signal is being activated by said second signal transmitting circuit.

5. A signal transmitting device in a semiconductor apparatus according to either of claim 1, 2, or 4, wherein the second signal transmitting circuit has gate stages smaller in number than the number of gate stages of the first signal transmitting circuit.

6. A signal transmitting device in a semiconductor apparatus according to either of claim 1, 2, or 4, wherein the second signal transmitting circuit is adapted to inactivate the third signal before the first signal is turned to the inactivated state from the activated state, and the third signal transmitting circuit is adapted to inactivate the fourth signal by inactivating the second signal by the first signal transmitting circuit.

7. A signal transmitting device in a semiconductor apparatus according to either of claims 1, 2, or 4, wherein the first signal transmitting circuit has a flip-flop circuit for latching the second signal.

8. A signal transmitting device in a semiconductor apparatus according to claim 7, wherein the first signal transmitting circuit has, at a stage before the flip-flop circuit, a noise removing circuit for removing noise mixingly entered in the first signal, thus preventing said flip-flop circuit from being set or reset due to said noise.

9. A signal transmitting device in a semiconductor apparatus according to claim 3, wherein the fourth signal from the third signal transmitting circuit is entered into an output buffer circuit of a DRAM, and the second signal transmitting circuit is adapted to generate the third signal when said DRAM is in a read mode.

10. A signal transmitting device in a semiconductor apparatus according to claim 3, wherein the second signal transmitting circuit has gate stages smaller in number than the number of gate stages of the first signal transmitting circuit.

11. A signal transmitting device in a semiconductor apparatus according to claim 3, wherein the second signal transmitting circuit is adapted to inactivate the third signal before the first signal is turned to the inactivated state from the activated state, and the third signal transmitting circuit is adapted to inactivate the fourth signal by inactivating the second signal by the first signal transmitting circuit.

12. A signal transmitting device in a semiconductor apparatus according to either of claims 1, 2 or 4, wherein the second signal transmitting circuit has gate stages smaller in number than the number of gate stages of the first signal transmitting circuit, and further wherein the second signal transmitting circuit is adapted to inactivate the third signal before the first signal is turned to the inactivated state from the activated state, and the third signal transmitting circuit is adapted to inactivate the fourth signal by inactivating the second signal by the first signal transmitting circuit.

13. A signal transmitting device in a semiconductor device according to claim 3, wherein the first signal transmitting circuit has a flip-flop circuit for latching the second signal.

14. A signal transmitting device in a semiconductor device according to either of claims 1, 2 or 4, wherein the second signal transmitting circuit has gate stages smaller in number than the number of gate stages of the first signal transmitting circuit, further wherein the second signal transmitting circuit is adapted to inactivate the third signal before the first signal is turned to the inactivated state from the activated state, and the third signal transmitting circuit is adapted to inactivate the fourth signal by inactivating the second signal by the first signal transmitting circuit, and further wherein the first signal transmitting circuit has a flip-flop circuit for latching the second signal.

15. A signal transmitting device in a semiconductor apparatus according to claim 4, wherein the fourth signal from the third signal transmitting circuit is entered into an output buffer circuit of a DRAM, and the second signal transmitting circuit is adapted to generate the third signal when said DRAM is in a read mode.

* * * * *